INVENTOR.
VERNON W. LYM,
BY
Paul M. Coble
ATTORNEY.

INVENTOR.
VERNON W. LYM,
BY
Paul M. Coble
ATTORNEY

United States Patent Office 3,444,397
Patented May 13, 1969

3,444,397
VOLTAGE ADJUSTABLE BREAKDOWN DIODE EMPLOYING METAL OXIDE SILICON FIELD EFFECT TRANSISTOR

Vernon W. Lym, Torrance, Calif., assignor to Hughes Aircraft Company, Culver City, Calif., a corporation of Delaware Filed July 21, 1966, Ser. No. 566,883
Int. Cl. H03k 3/26
U.S. Cl. 307—302 4 Claims

ABSTRACT OF THE DISCLOSURE

In the disclosed breakdown device there is applied between the source and drain electrodes of a metal oxide silicon field effect transistor a reverse voltage of a magnitude sufficient to estabish voltage breakdown in the field effect transistor between the source and drain electrodes. A reverse bias voltage is applied between the gate and source electrodes, and a variable bias voltage of the same polarity as the gate-source bias voltage but of a magnitude less than that of the gate-source voltage is applied between the substrate and source electrodes to control the source-drain voltage at which the breakdown occurs.

This invention relates to semiconductor devices, and more particularly relates to a semiconductor breakdown diode having a readily adjustable breakdown voltage.

In typical breakdown diodes of the avalanche or Zener type, the magnitude of the reverse voltage across the diode increases with increasing reverse current (with a very high resistance) until a breakdown voltage is reached, after which the voltage remains essentially constant regardless of the current. The voltage at which breakdown occurs is a function of certain constructional parameters of the diode, such as the impurity concentration in the semiconductor material, and for all practical purposes remains at a fixed value for a given diode. In many instances, however, it would be desirable to be able to readily adjust the breakdown voltage to different desired values.

Accordingly, it is an object of the present invention to provide a breakdown device in which the breakdown voltage may be readily adjusted.

It is a further object of the invention to provide a reliable and durable breakdown diode employing a metal oxide silicon field effect transistor.

It is a still further object of the invention to provide a breakdown diode in which the breakdown voltage may be varied over a wide range of voltages by means of an applied control voltage.

In accordance with the foregoing objects, the breakdown device of the present invention includes a metal oxide silicon field effect transistor having a source electrode, a drain electrode, a gate electrode, and a substrate electrode. A current path is provided between the source electrode and the drain electrode, and bias means are coupled to the gate electrode, to the substrate electrode, and to the source electrode. The bias means applies a variable DC voltage between the substrate electrode and the source electrode and applies a DC voltage of a magnitude not less than that of the variable DC voltage between the gate electrode and the source electrode. The variable DC voltage applied between the substrate and the source electrodes determines the breakdown voltage of the device.

Additional objects, advantages, and characteristic features of the present invention will become readily apparent from the following detailed description of preferred embodiments of the invention when considered in conjunction with the accompanying drawing in which.

Figure 1:
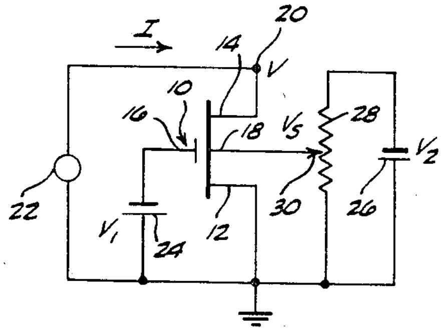
FIG. 1 is a schematic circuit diagram illustrating a breakdown diode in accordance with one embodiment of the present invention.

Referring to FIG. 1 with greater particularity, a breakdown diode in accordance with the invention may be seen to include a planar metal oxide silicon field effect transistor (MOS FET) designated generally by the numeral 10 and having a source electrode 12, a drain electrode 14, a gate electrode 16, and a substrate electrode 18. The transistor 10 is illustrated as an N-type channel device, i.e., a device including a channel of N-type material disposed between two heavily doped N-type electrodes on or in a P-type substrate. The channel material may, however, initially be of P-type which is effectively converted to N-type by an electric field due to charge on the gate electrode. Also, it is pointed out that P-type channel devices (which possess respective conductivity regions opposite to those of N-type channel devices) are also suitable, in which case the polarities of the bias potentials would be reversed from those shown. An example of a particular MOS FET which may be employed as the transistor 10 is a 2N4038 metal oxide silicon field effect transistor manufactured by TRW Semiconductors Inc., Lawndale, Calif.

The drain electrode 14 of the MOS FET 10 is directly connected to a terminal 20 at which a voltage V appears, while the source electrode 12 is directly connected to a level of reference potential designated as ground. It is pointed out that all voltages referred to herein are measured with respect to the ground level. A current source 22 may be connected between the terminal 20 and ground to supply a source-drain current I to the MOS FET 10. A first source of potential 24 furnishing a DC bias voltage $V_1$, which may be −12 volts for example, is connected between gate electrode 16 and the ground level. A second source of pótential 26 providing a DC voltage $V_2$, which may be −12 volts for example, is employed to supply a variable DC bias voltage $V_s$ between the substrate electrode 18 and ground. The voltage $V_s$ may be obtained from a potentiometer 28 connected across the source 26, the potentiometer 28 having a movable tap 30 which is connected to the substrate electrode 18.

It is pointed out that the polarities with which the sources 22, 24, and 26 are connected into the circuit are such that source-drain current flows through the MOS FET 10 in a reverse direction, while reverse bias voltages are applied between the gate and source electrodes and between the substrate and source electrodes. By reverse direction it is meant that current (positive charge) flow is in a direction opposite to that for conventional operation. Thus, for the N-type channel MOS FET 10 of FIG. 1, current flow through the device 10 is in a direction from the source electrode 12 to the drain electrode 14 (for a P-type channel MOS FET current flow would be from the drain electrode to the source electrode). By reverse bias voltages it is meant that the gate-to-source voltage is opposite to that for conventional operation, and the substrate-to-source voltage has the same polarity as the gate-to-source voltage (measured with respect to the source electrode). Conventionally, an N-type channel MOS FET is operated with both its gate and drain electrodes biased positively with respect to its source electrode, and with its substrate and source electrodes at the same potential (the gate and drain electrodes of a P-type channel MOS FET are conventionally biased negatively with respect to the source electrode). Thus, for the N-type channel MOS FET 10 of FIG. 1, both the gate electrode 16 and the substrate electrode 18 are biased negatively with respect to the source electrode 12, the magnitude of the substrate-to-source voltage not exceeding that of the gate-to-source voltage.

Figure 2:
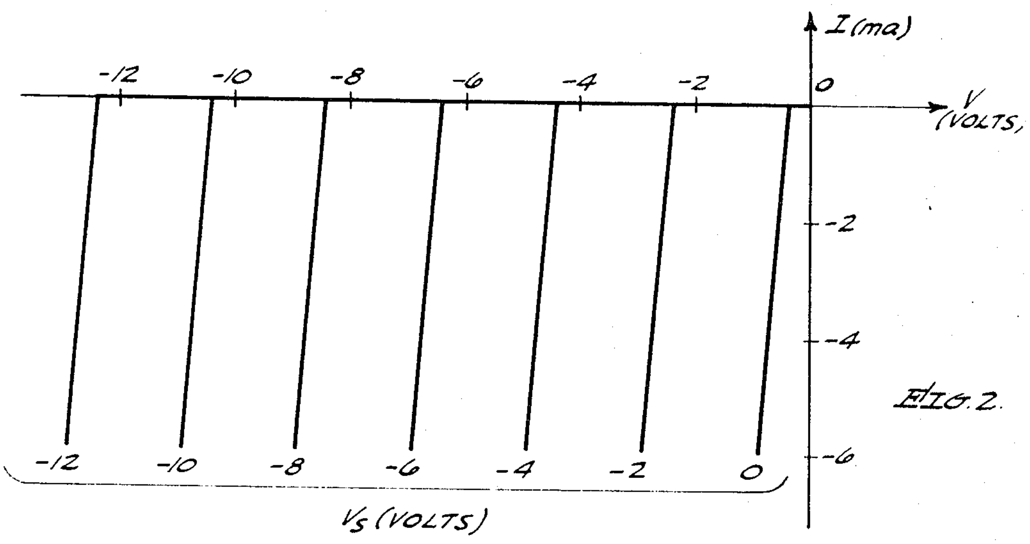
FIG. 2 is a graph illustrating a family of source-drain current-voltage curves for various values of substrate voltage for the diode of FIG. 1.
Figure 3:
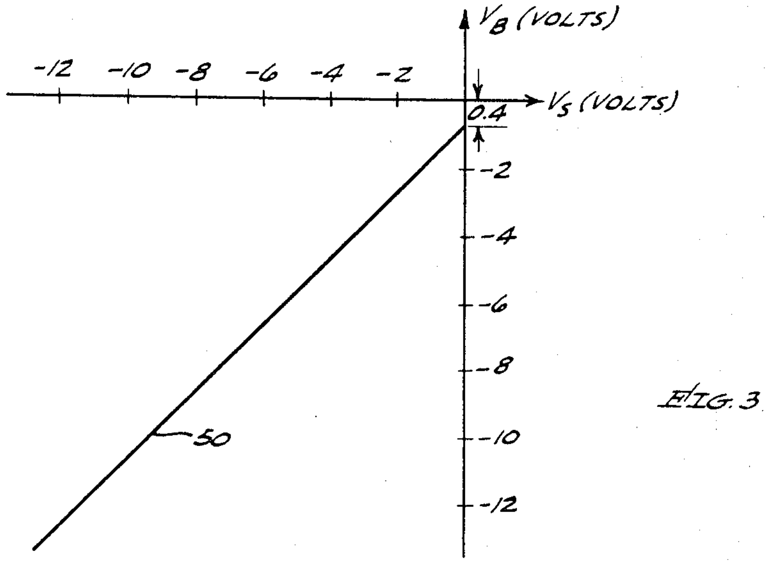
FIG. 3 is a graph showing the breakdown voltage as a function of the substrate voltage for the diode of FIG. 1.

Curves showing the source-drain current I as a function of the voltage V between the drain electrode 14 and the source electrode 12 for various values of substrate voltage $V_s$ for the device of FIG. 1 (the gate voltage $V_1$ being fixed at −12 volts) are given in FIG. 2. From this figure it may be seen that for a substrate voltage of zero volts a sharply defined breakdown occurs at approximately −0.4 volt, and as the substrate voltage becomes increasingly negative, a series of breakdown voltages respectively equal to approximately ($V_s$−.4) volts are afforded. Thus, it may be seen that the breakdown voltage may be readily adjusted simply by varying the substrate voltage $V_s$. The manner in which the breakdown voltage $V_B$ varies as a function of the substrate voltage $V_s$ is depicted by the curve 50 of FIG. 3.

Figure 4:
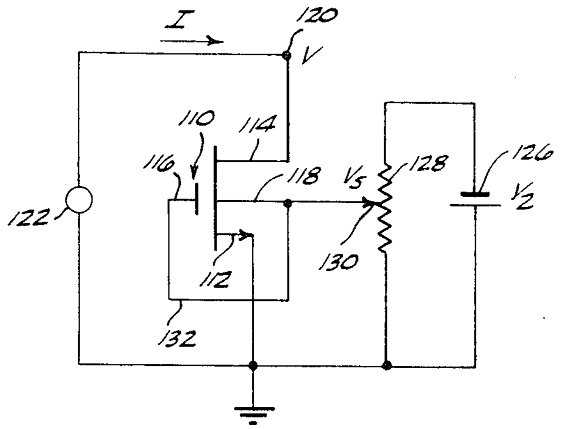
FIG. 4 is a schematic circuit diagram illustrating a breakdown diode in accordance with another embodiment of the invention.

In an alternate embodiment of the present invention, rather than providing separate bias voltages for the gate and substrate electrodes, the gate and substrate electrodes are electrically connected together and are driven from the same source of potential. Since the embodiment of FIG. 4 is otherwise quite similar to that of FIG. 1, components in the embodiment of FIG. 4 are designated by the same reference numerals as corresponding components in the embodiment of FIG. 1 except for the addition of the prefix numeral 1. Also, in the embodiment of FIG. 4 the gate electrode 116 and the substrate electrode 118 are directly interconnected via a lead 132.

Figure 5:
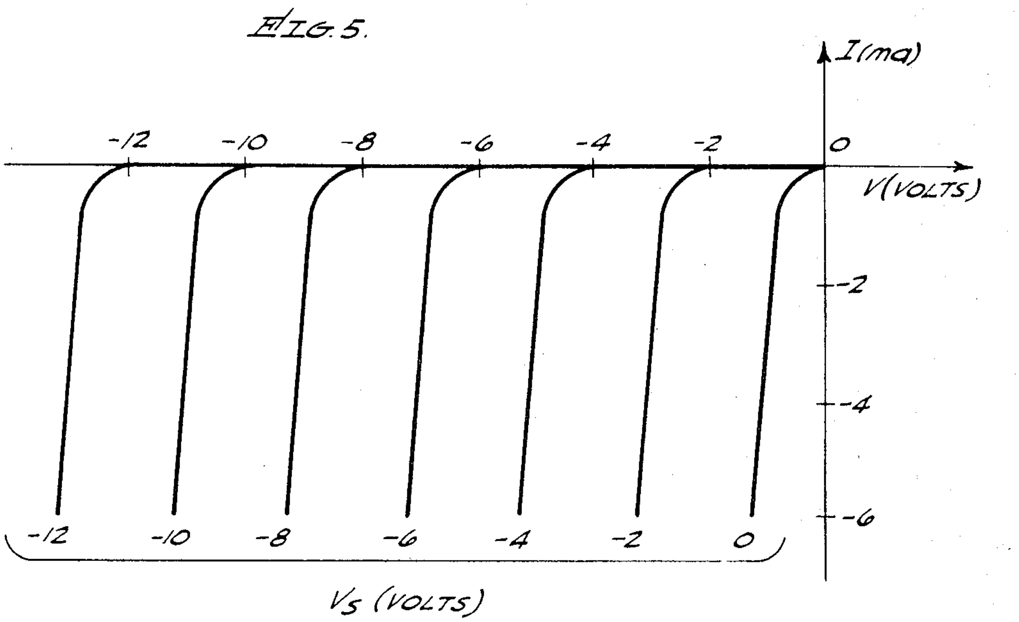
FIG. 5 is a graph showing a family of source drain current-voltage curves for various values of substrate voltage for the diode of FIG. 4.

Curves illustrating the source drain-current I as a function of the voltage V between the drain and source electrodes 114 and 112, respectively, for various values of substrate voltage $V_s$ for the device of FIG. 4 are given in FIG. 5. The current-voltage characteristic curves of FIG. 5 may be seen to resemble the curves of FIG. 2, except that rather than possessing a sharply defined breakdown point, the curves of FIG. 5 have a rounded corner in the vicinity of the breakdown value.

The theory underlying the achievement of the aforedescribed variable breakdown effect when biasing the MOS FETs 10 and 110 in the unique manner set forth herein is not fully understood at this time. This lack of understanding is due in part to the relatively small amount of data which has been obtained when operating MOS FETs in the variable breakdown mode by utilizing the aforedescribed reverse bias arrangement which is totally contrary to conventional biasing schemes. It is believed, however, that the current channel between the source and drain electrodes is held in a pinched-off condition by means of the bias potential applied to the gate electrode. The substrate electrode potential is then apparently able to control the effective carrier concentration in the substrate and thereby control the breakdown voltage.

Thus, the present invention is able to provide a breakdown diode having a well defined breakdown voltage which is adjustable over a wide range of values simply by varying an applied control voltage.

Although the present invention has been shown and described with reference to particular embodiments, nevertheless various changes and modifications obvious to a person skilled in the art to which the invention pertains are deemed to lie within the spirit, scope and contemplation of the invention as set forth in the appended claims.

What is claimed is:

1. A voltage adjustable breakdown device comprising: a metal oxide silicon field effect transistor having a source electrode, a drain electrode, a gate electrode, and a substrate electrode; means coupled between said source electrode and said drain electrode for applying a reverse voltage therebetween of a magnitude sufficient to establish voltage breakdown in said field effect transistor between said source and drain electrodes; and means coupled to said gate electrode, to said substrate electrode, and to said source electrode for applying a variable reverse bias voltage of a predetermined magnitude between said substrate electrode and said source electrode and for applying a reverse bias voltage of a magnitude greater than that of said variable reverse bias voltage between said gate electrode and said source electrode to control the source-drain voltage at which said breakdown occurs.

2. A voltage adjustable breakdown device comprising: an N-type channel metal oxide silicon field effect transistor having a source electrode, a drain electrode, a gate electrode, and a substrate electrode; means coupled between said source electrode and said drain electrode for applying a reverse voltage therebetween of a magnitude sufficient to establish voltage breakdown in said field effect transistor between said source electrode and said drain electrode; and means coupled to said gate electrode, to said substrate electrode, and to said source electrode for applying between said substrate electrode and said source electrode a variable DC voltage of a polarity to bias said substrate electrode negatively with respect to said source electrode and for applying between said gate electrode and said source electrode a DC voltage of a magnitude greater than that of said variable DC voltage and of a polarity to bias said gate electrode negatively with respect to said source electrode to control the source-drain voltage at which said breakdown occurs.

3. A voltage adjustable breakdown device comprising: a metal oxide silicon field effect transistor having a source electrode, a drain electrode, a gate electrode, and a substrate electrode; means coupled between said source electrode and said drain electrode for applying a reverse voltage therebetween of a magnitude sufficient to establish voltage breakdown in said field effect transistor between said source and drain electrodes; means for applying a reverse bias voltage of a predetermined magnitude between said gate electrode and said source electrode; and means for applying a variable bias voltage of a magnitude less than said predetermined magnitude between said substrate electrode and source electrode to control the source-drain voltage at which said breakdown occurs, said variable bias voltage having the same polarity as said reverse bias voltage with respect to said source electrode.

4. A voltage adjustable breakdown device comprising: an N-type channel metal oxide silicon field effect transistor having a source electrode, a drain electrode, a gate electrode, and a substrate electrode; means coupled between said source electrode and said drain electrode for applying a reverse voltage therebetween of a magnitude sufficient to establish voltage breakdown in said field effect transistor between said source electrode and said drain electrode; means for applying a first DC voltage between said gate electrode and said source electrode, said first DC voltage being of a polarity to bias said gate electrode negatively with respect to said source electrode; and means for applying a second and variable DC voltage of a magnitude less than that of said first DC voltage between said substrate electrode and said source electrode to control the source-drain voltage at which said breakdown occurs, said second DC voltage being of a polarity to bias said substrate electrode negatively with respect to said source electrode.

References Cited

UNITED STATES PATENTS

| | | | |
|---|---|---|---|
| 3,131,312 | 4/1964 | Putzrath | 307—304 X |
| 3,268,658 | 8/1966 | Schroeder et al. | 317—235 X |
| 3,311,756 | 3/1967 | Nagata et al. | 307—304 |
| 3,321,680 | 5/1967 | Arndt et al. | 317—234 X |

OTHER REFERENCES

S. R. Hofstein and F. P. Heiman. The Silicon Insulated-Gate Field-Effect Transistor, proceedings of the IEEE. p. 1190, 1196, September 1963.

ARTHUR GAUSS, *Primary Examiner.*

J. D. FREW, *Assistant Examiner.*